United States Patent
Patel et al.

(10) Patent No.: US 6,919,727 B2
(45) Date of Patent: Jul. 19, 2005

(54) ACCURATE TIME MEASUREMENT SYSTEM CIRCUIT AND METHOD

(75) Inventors: Gunvant T. Patel, Garland, TX (US); Nicholas Flores, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 10/255,342

(22) Filed: Sep. 26, 2002

(65) Prior Publication Data

US 2004/0061507 A1 Apr. 1, 2004

(51) Int. Cl.[7] .................. G01R 31/08; G01R 23/02; G01R 27/28
(52) U.S. Cl. .............. 324/535; 324/76.74; 324/617
(58) Field of Search ................ 324/535, 532, 324/617, 625, 76.74, 76.78, 620; 702/79, 72, 106, 69; 714/815, 823

(56) References Cited

U.S. PATENT DOCUMENTS

| | | | | |
|---|---|---|---|---|
| 3,794,935 A | * | 2/1974 | Tsuchiya et al. | 333/28 R |
| 4,318,617 A | * | 3/1982 | Orsen | 356/619 |
| 4,472,725 A | * | 9/1984 | Blumenkranz | 330/149 |
| 4,710,889 A | * | 12/1987 | Wason | 702/94 |
| 5,218,289 A | * | 6/1993 | Besson | 324/76.78 |
| 6,545,487 B1 | * | 4/2003 | Ly | 324/620 |
| 6,550,036 B1 | * | 4/2003 | Panis | 714/815 |

OTHER PUBLICATIONS

Merriam–Webster's Collegiate Dictionary Tenth Edition, p. 228.*

* cited by examiner

*Primary Examiner*—Anjan K. Deb
(74) *Attorney, Agent, or Firm*—W. Daniel Swayze, Jr.; W. James Brady; Frederick J. Telecky, Jr.

(57) ABSTRACT

Disclosed is a method of measuring the time signal of an electronic device including steps for measuring a true signal and an inverted signal. The measured true path signal and inverted path signal are combined to reduce measurement error and provide an accurate measurement of the time signal of the device under test. Also disclosed is an interface for use between a device-under-test and test equipment. The interface includes means for alternately switching a time signal from the device-under-test to provide a true signal path and an inverted signal path for measurement. A system embodiment of the invention is also disclosed in which an interface and measuring means are used to alternately measure and combine a true signal and an inverted signal to provide an accurate time measurement result.

16 Claims, 2 Drawing Sheets

ACCURATE TIME MEASUREMENT SYSTEM CIRCUIT AND METHOD

TECHNICAL FIELD

The invention relates to providing accurate time measurements for testing electronic devices. More particularly, the invention provides methods, circuits, and systems for improved device output time signal test measurements.

BACKGROUND OF THE INVENTION

The accuracy of any time measurement circuit is impacted by skew and propagation delays in the path of the signal to be measured. Inaccuracies in the measurement of a signal are caused in part by differences in the rising edge and falling edge propagation delays. It is known in the arts to use calibration circuits or software-generated offsets based on mathematical predictions modeling circuit characteristics in an attempt to produce accurate time measurements. Using such techniques, accuracy of plus or minus 5 nanoseconds is sometimes achievable under certain conditions.

The problem of hardware distortion of a time signal to be measured is illustrated in FIG. 1. The period 10, or frequency of a device time signal 12 is shown. The 50% duty cycle of the device 14 is indicative of a steady time signal 12 output by the device-under-test. The automatic test equipment (ATE) receiving circuitry 16 receives the signal 12 for measurement. Due to delays introduced by the ATE receiving circuitry hardware 16, the signal 18 actually measured by the ATE measurement unit 20 is distorted. The measured signal 18 thus does not exhibit a 50% duty cycle 22. This distortion effect is anticipated, however, and is typically addressed by the inclusion of calibration hardware, or alternatively is removed from the measurement output using mathematical calibration offset techniques. The calibration hardware and offsets known in the arts are based upon assumptions concerning testing scenarios and are commonly fixed at the time of calibration.

Further problems exist with conventional time measurement circuits and methods making use of calibration circuits and measurement offsets. Typically, such calibration circuits or offset computations are based on assumptions concerning test conditions and predicted external factors such as, for example, device temperature, humidity, and power supply drift or changes. Changes in actual test conditions therefore can render the assumptions false. Failure to adapt the test equipment to actual test conditions may result in a decrease in accuracy. Adaptation to new test conditions requires that adjustments be made to the test equipment in order to compensate for the changed conditions. Also, test equipment must be recalibrated periodically in order to verify the accuracy of test results. As a result, the testing process is made undesirably complex, sensitive to external factors, and prone to error.

It would be useful and advantageous to provide improved testing circuits and methods which would decrease error and increase accuracy while reducing the influence of external factors on measurement results. Devices and methods capable of adapting to dynamic test conditions would offer further advantages including but not limited to improved accuracy under actual test conditions and extending the usefulness of available test equipment.

SUMMARY OF THE INVENTION

According to one aspect of the invention, a signal from a device-under-test and an inverse of its signal are measured and used in combination such that an accurate time measurement result is provided.

In carrying out the principles of the present invention, in accordance with an embodiment thereof, a method of measuring the time signal of an electronic device includes a step of buffering the time signal of the device-under-test. Further steps provide for alternately switching the buffered device signal between a true path and an inverted path and measuring the true path signal and the inverted path signal. The measured true path signal and inverted path signal are manipulated to provide an accurate measurement of the time signal of the device-under-test.

According to another aspect of the invention, an interface for a device-under-test and test equipment is provided. The interface includes means for receiving a time signal output from a device-under-test. Means for buffering the time signal and for alternately switching the buffered signal between a true path and an inverted path are provided. Further provided are means for conveying the true path signal and the inverted path signal to the test equipment.

According to another aspect of the invention, a system for measuring the time signal of an electronic device is embodied in an interface coupled to measuring means. The interface is disposed between a device-under-test and measuring means adapted for measuring the output of the interface and providing an accurate measurement of the device signal.

The invention provides technical advantages including but not limited to improved accuracy of time measurements, simplified testing under changing conditions, reduced influence of external factors, and extending the utility of existing test equipment. These and other features, advantages, and benefits of the present invention will become apparent to one of ordinary skill in the art upon careful consideration of the detailed description of a representative embodiment of the invention in connection with the accompanying drawings.

BRIEF DESCRIPTION OF THE DRAWINGS

The present invention will be more clearly understood from consideration of the following detailed description and drawings in which.

References in the detailed description correspond to like references in the figures unless otherwise noted. Like numerals refer to like parts throughout the various figures. Descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles, features, and advantages of the invention.

DETAILED DESCRIPTION OF PREFERRED EMBODIMENTS

In general, the invention provides circuits, systems, and methods for making accurate measurement of device time output signals. It should be understood that the invention may be practiced for the testing of various devices using various commercially available test equipment familiar to those skilled in the arts.

Figure 1:
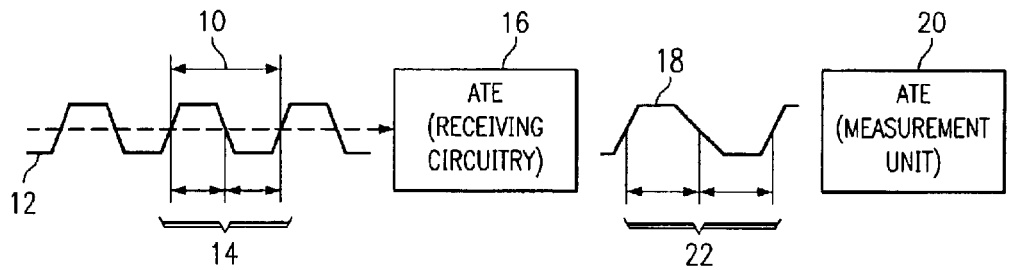
FIG. 1 (prior art) is a depiction of an example of problems encountered in the measurement of a device time signal according to the prior art.
Figure 2:
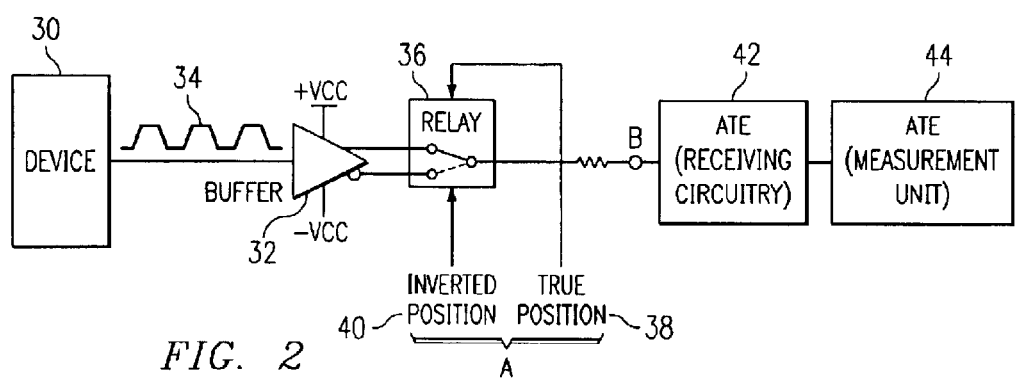
FIG. 2 is a block diagram illustrating an example of a circuit and method of measuring a device time signal according to the invention.

Representatively illustrated in FIG. 2, a block diagram of a preferred embodiment of the invention is shown. The device-under-test 30, which may be any electronic device having a time output signal, is operatively coupled to a buffer 32. Preferably the buffer 32 is a high-speed differential op-amp having a fast slew rate. The buffer 32 receives a device-under-test time output signal 34, and is coupled to a high-speed relay 36 for switching the time output signal 34 between a true position 38 and an inverted position 40. In turn, the true position signal 38 and the inverted position signal 40 are input into the test equipment, in this example, automatic test equipment (ATE) receiving circuitry 42. The true signal 38 and inverted signal 40 are measured by the ATE measurement unit 44.

Figure 3A:
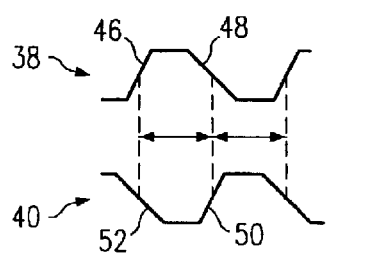
FIG. 3A is a graphical example of device time signal measurement according to the invention.

Now referring primarily to FIG. 3A, examples of measurements obtained from the true signal 38 and inverted signal 40 indicated by arrows A—A of FIG. 2 are shown. It can be seen that the true signal 38 rise time measurement 46 accurately reflects the device time output signal 34, while the true signal 38 fall time measurement 48 appears distorted. Similarly the inverted signal 40 rise time measurement 50, appears to be an accurate reflection of the device time output signal 34, while the inverted signal 40 fall time measurement 52 appears to be distorted. It should be appreciated that the true signal measurement 38 and the inverted signal measurement 40 both exhibit asymmetrical duty cycles, that is, duty cycles that are not 50 percent. It should be understood that the invention described herein measures the actual distortion rather than relying on efforts to anticipate the effects of the distortion and avoid it or compensate for it in the final measurement result.

Figure 3B:
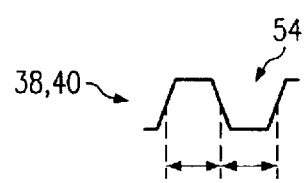
FIG. 3B is a further graphical example of device time signal measurement results according to the invention.

As shown in FIG. 3B, when the true path signal measurement 38 and inverted path signal measurement 40 of FIG. 3A are combined, the resulting composite signal 54 provides an accurate time measurement of the device output time signal 34, with the measured signal 54 exhibiting a 50 percent duty cycle. Preferably, the measured signal 54 is obtained by summing the measured true signal 38, shown in FIG. 3A, and the measured inverted signal 40, also shown in FIG. 3A. The resulting sum is then preferably divided by two, their being two components in the sum, to produce the composite signal 54, which is an accurate measurement of the time output signal 34 of the Device-under-test 30. Thus, the invention makes use of the hardware distortion in the measurement of the device-under-test by using the error present in the measured signal and the error present in the measured inverted signal to cancel one another in the result. In this way, accuracy is increased and distortion is dealt with dynamically in response to actual test conditions in real time.

Figure 4:
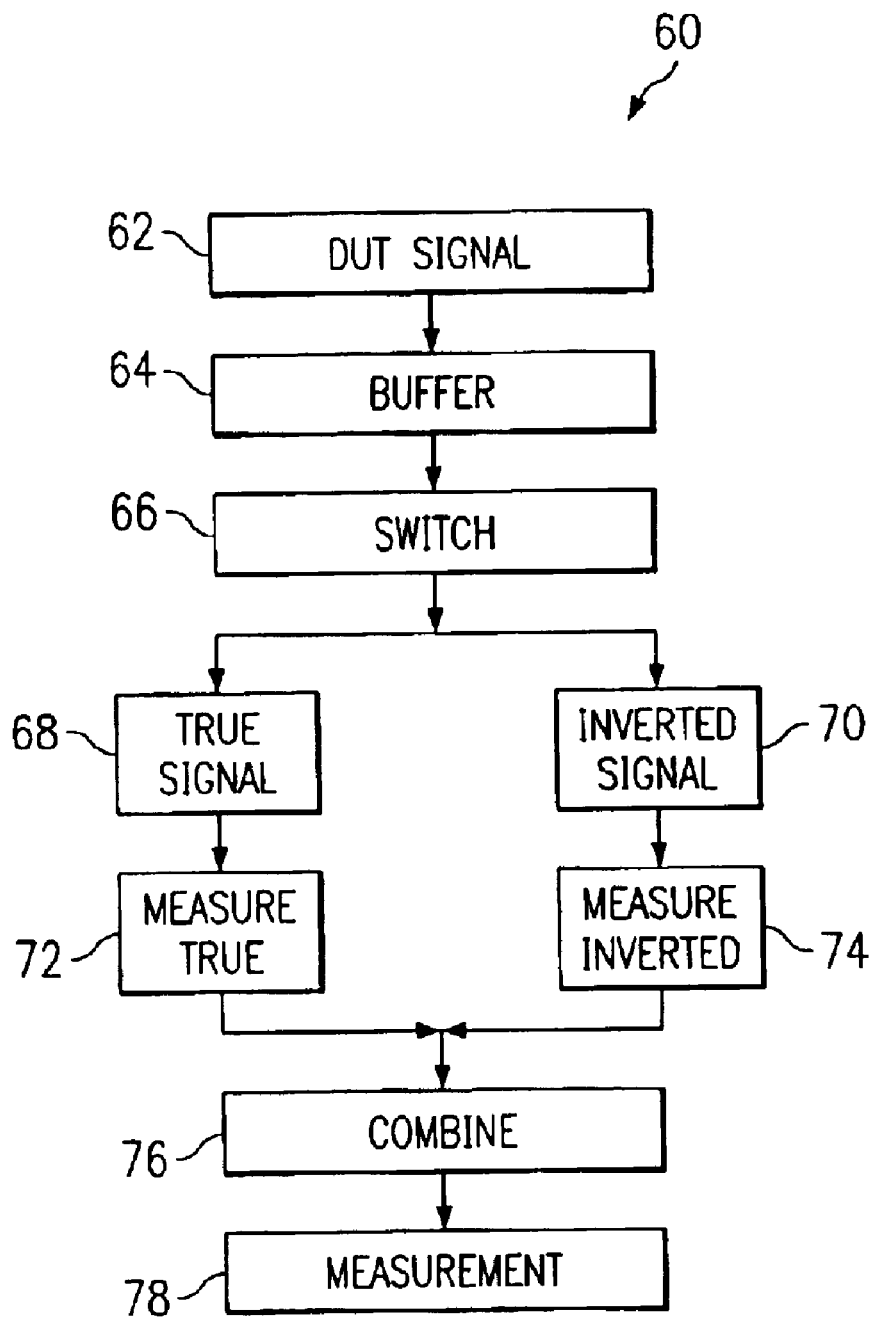
FIG. 4 is a process flow diagram showing exemplary steps in a preferred method of the invention.

FIG. 4 is an illustration of the process flow 60 showing steps in a preferred embodiment of the invention. The Device-under-test output time signal is received 62 at the testing interface and is buffered 64. The Device-under-test output time signal is switched 66 between a true signal path 68 and an inverted signal path 70, each of which is measured independently, as indicated at steps 72 and 74 respectively. The measured true signal and measured inverted signal are combined 76, preferably by summing and dividing by two, and the resulting measurement is provided 78. It should be appreciated by those skilled in the arts that the measurement and combining steps result in the cancellation of certain errors, such as propagation delays. Of course, some variation in the steps or sequence of steps is possible without departure from the principles of the invention.

Thus, the invention provides accurate device time signal time measurement adaptable for use with existing test equipment. Various technical advantages are provided by the invention, including but not limited to increased accuracy from existing equipment, dynamic adaptation to actual test conditions, and test results less susceptible to external factors. While the invention has been described with reference to certain illustrative embodiments, the description of the methods, systems, and devices described are not intended to be construed in a limiting sense. Various modifications and combinations of the illustrative embodiments as well as other advantages and embodiments of the invention will be apparent to persons skilled in the art upon reference to the description and claims.

We claim:

1. A method of measuring the time signal of an electronic device comprising the steps of:

measuring the time signal to obtain a true measurement wherein a true hardware distortion is included in the true measurement;

measuring an inverse of the time signal to obtain an inverse measurement wherein an inverse hardware distortion is included in the inverse measurement; and combining the true measurement and the inverse measurement such that the true hardware distortion and the inverse hardware distortion at least partially cancel one another to produce a time measurement result.

2. A method of measuring the time signal of an electronic device according to claim 1 further comprising the step of buffering the time signal.

3. A method of measuring the time signal of an electronic device according to claim 1 further comprising the step of converting the time signal to a true signal and an inverted signal.

4. A method of measuring the time signal of an electronic device according to claim 3 further comprising the step of alternately switching between the true signal and the inverted signal for performing the measuring steps.

5. A method of measuring the time signal of an electronic device according to claim 4 wherein the switching step further comprises the step of controlling the true signal and the inverted signal with a relay.

6. A method of measuring the time signal of an electronic device according to claim 1 wherein the combining step further comprises the step of summing of the true measurement and the inverse measurement.

7. A method of measuring the time signal of an electronic device according to claim 1 wherein the combining step further comprises the step of dividing the sum of the true measurement and the inverted measurement by two.

8. A method of measuring the time signal of an electronic device according to claim 1 wherein the time measurement result is accurate to within less than approximately plus or minus 5 ns of overall system accuracy specifications.

9. A method of measuring the time signal of an electronic device according to claim 1 wherein the time measurement result is accurate to within approximately plus or minus 1 ns of overall system accuracy specifications.

10. A method of measuring the time signal of an electronic device comprising the steps of:

buffering the time signal;

alternately switching the buffered time signal between a true path and an inverted path;

alternately measuring a true path signal and an inverted path signal; and combining the measured true path signal and the measured inverted path signal to provide a time signal measurement result to cancel a portion of the true hardware distortion and the inverse hardware distortion.

11. A method of measuring the time signal of an electronic device according to claim 10 wherein the combining step further comprises the step of summing of the measured true path signal and the measured inverted path signal.

12. A method of measuring the time signal of an electronic device according to claim 10 wherein the combining step further comprises the step of dividing the sum of the measured true path signal and the measured-inverted path signal by two.

13. A method of measuring the time signal of an electronic device according to claim 10 wherein the buffering step further comprises the step of converting the device signal to a true signal and an inverted signal.

14. A method of measuring the time signal of an electronic device according to claim 10 wherein the switching step further comprises the step of controlling the true signal and the inverted signal with a relay.

15. A method of measuring the time signal of an electronic device according to claim 10 wherein the time measurement result is accurate to within less than approximately plus or minus 5 ns of overall system accuracy specifications.

16. A method of measuring the time signal of an electronic device according to claim 10 wherein the time measurement result is accurate to within approximately plus or minus 1 ns of overall system accuracy specifications.

* * * * *